United States Patent [19]

Yokoyama et al.

[11] Patent Number: 4,467,295
[45] Date of Patent: Aug. 21, 1984

[54] SOLID ULTRASONIC DELAY LINE

[75] Inventors: Takeo Yokoyama, Ebina; Ichiya Imai, Ayase; Hideaki Asaoka, Sagamihara, all of Japan

[73] Assignee: Showa Electric Wire & Cable Co., Ltd., Kanagawa, Japan

[21] Appl. No.: 424,494

[22] Filed: Sep. 27, 1982

[30] Foreign Application Priority Data

Nov. 25, 1981 [JP] Japan .............................. 56-188635
Apr. 30, 1982 [JP] Japan ................................ 57-73836
Apr. 30, 1982 [JP] Japan ................................ 57-73837

[51] Int. Cl.³ .......................... H03H 9/36; H03H 9/13
[52] U.S. Cl. .................................. 333/141; 333/142; 333/143; 333/149
[58] Field of Search .............................. 333/141–145, 333/147–149; 310/322, 326, 327, 333, 334, 357, 365, 366

[56] References Cited

U.S. PATENT DOCUMENTS 2,859,415 11/1958 Fagen .................................. 333/143
3,296,561 1/1967 Polucci ............................... 333/143
3,387,233 6/1968 Parker, Jr. ........................... 333/149
3,832,655 8/1974 Yokoyama ........................... 333/142

FOREIGN PATENT DOCUMENTS 1370837 10/1974 United Kingdom ................ 333/142

Primary Examiner—Marvin L. Nussbaum
Attorney, Agent, or Firm—Kenway & Jenney

[57] ABSTRACT

There is disclosed a solid ultrasonic delay line which comprises a delay medium having two parallel major faces and at least three end faces intersecting the major faces, an input transducer bonded to one of the end faces and polarized in a direction parallel to the major faces for transmitting an ultrasonic signal in a shear mode into the delay medium, and an output transducer bonded to one of the end faces for converting the ultrasonic signal having propagated through the delay medium into an electrical signal. The input and output transducers have boundary surfaces lying flush with the two major faces of the delay medium, the major faces and the boundary surfaces being ground to a surface roughness which is one-twentieth or smaller of the wavelength of the ultrasonic signal propagating through the delay medium. The major faces sandwich a path of the ultrasonic signal propagating through the delay medium and are spaced from each other by a distance which is subjected to variations that are one-twentieth or smaller of the wavelength of the ultrasonic signal propagating through the delay medium.

11 Claims, 13 Drawing Figures

SOLID ULTRASONIC DELAY LINE

BACKGROUND OF THE INVENTION

The present invention relates to a solid ultrasonic delay line for providing a delayed signal by propagating an ultrasonic signal through a solid delay medium such as of glass, and more particularly to such a solid ultrasonic delay line of a shear mode in which a dispersive mode signal is suppressed to a practically sufficient degree.

Glass delay lines are widely used in color television receivers, video disk reproducing units, video tape recorders and the like. One such glass delay line is illustrated in FIG. 1 of the accompanying drawings. As shown in FIG. 1, a delay medium D has two major faces 1, 2 and five end faces 3, 4, 5, 6, 7 intersecting the major faces 1, 2. An input transducer 8 is bonded to the end face 3 and an output transducer 9 is bonded to the end face 4. An ultrasonic energy which is produced by the input transducer 8 is propagated in the delay medium along reflected paths shown by the arrows toward the output transducer 9. The input transducer 8 serves to convert an electrical signal into an ultrasonic signal which is polarized parallel to the major faces 1, 2 of the delay medium D so that an ultrasonic signal of a shear mode will be generated. The shear mode ultrasonic signal is then fed to the output transducer 9 and reconverted thereby into an electrical signal.

The delay line of the above construction is characterized in that it can well be mass-produced and is capable of easily processing spurious signals. For the propagation of only nondispersive mode (zero mode) ultrasonic signals, it is necessary to employ transducers having a thickness equal to that of the delay medium. Stated otherwise, the input and output transducers 8, 9 have boundary surfaces 10, 11, 12, 13 lying flush with the two major faces 1, 2 of the delay medium D. For propagating of only zero mode ultrasonic signals, it is also necessary that the thickness of the delay medium be less than five times or preferably half the wavelength of the ultrasonic wave propagating in the delay medium.

The foregoing theory is described in IRE TRANSACTIONS, July 1960, pages 35 through 43. The mass production of delay lines is disclosed in U.S. Pat. No. 3,581,247, and removal of spurious signals is described in Japanese Patent Publication No. 47-27574 which claims Convention priority of Dutch patent application No. 6816005 filed Nov. 9, 1968. Particularly, the technology as described in U.S. Pat. No. 3,581,247 that delay lines as shown in FIG. 1 are mass-produced by slicing a block of glass to which transducers have been bonded has been employed by major manufacturers in the world because of its low cost production process. The thickness of the glass delay medium is generally selected to be about twice the wavelength of propagating signals for providing necessary strength.

As described above, the IRE TRANSACTIONS referred to above describes that the thickness of the delay medium should be less than half of the propagating wavelength for the propagation of only zero mode ultrasonic signals. However, no literature is available which would give a technical explanation as to why the delay line as illustrated in FIG. 1 can propagate zero mode ultrasonic signals even if the thickness of the delay line is several times greater than the wavelength of the propagating signal.

The present inventors have analyzed the above phenomenon and reached the following conclusion: The delay line as shown in FIG. 1 has plural mode paths according to prescribed rules in conformity with the conventional theory as long as the delay medium has a thickness of $\lambda/2$ or more, but the input and output transducers are incapable of transmitting and receiving signals other than zero mode signals. This arises out of the fact that the boundary surfaces of the transducers lie exactly flush with the major faces of the delay medium. The reason why the transducers cannot transmit and receive signal other than zero mode signals if the boundary surfaces of the transducers are flush exactly with the major faces of the delay medium will be described below.

FIG. 3 shows by way of example the manner in which a mode wave with $n=3$ propagates through a medium D. Waves $W_I$, $W_{II}$ are expressed by:

$$W_I = ce^{j(ky+\gamma x)}e^{jwt} \tag{1}$$

$$W_{II} = ce^{-j(ky-\gamma x)}e^{jwt} \tag{2}$$

where k is a propagation constant in the direction of y and $\gamma$ is a propagation constant in the direction of x. A composite wave $W_{III}$ is then given as follows:

$$W_{III} = c\{e^{j(ky+\gamma x)} + e^{-j(ky-\gamma x)}\}e^{jwt} \tag{3}$$

The above equation is indicative of the mode wave with $n=3$.

In FIG. 3, the direction of Y is vertical, the direction of X is horizontal, and the direction of Z is normal to the sheet of the drawing. The waveforms are all indicative of displacements in the direction of Z. The major faces of the delay medium are denoted by 1, 2 and the boundary surfaces of the transducer by 12, 13. The equation (3) can be modified as follows:

$$W_{III} = C' \cos ky \, e^{-j(\gamma x - wt)} \tag{4}$$

When $y = \pm b$, a boundary condition is $$\left.\frac{\partial W_{III}}{\partial y}\right|_{y=\pm b} = 0.$$

Therefore $$\sin ky \bigg|\bigg|_{y=\pm b} = 0,$$

and hence $k = n\pi/b'$ ($n=0, 1, 2 \ldots$). Accordingly, the wave III is found to be a mode wave advancing in the direction of X and vibrating according to the expression $e^{-j(\gamma x - wt)}$ while forming a standing wave as defined by $C' \cos (n\pi/b)y$ in the direction of Y.

The formation of a standing wave in the direction of Y in a zone is illustrated in FIG. 4. It is assumed now that a transducer as defined by A-B-C-C is bonded to the delay medium at a point $X=L$ thereon. The wave $W_{III}$ as expressed by the equation (4) goes through the transducer until it is reflected at the point $X=L$ as the boundary surfaces of the transducer lie flush with the major faces of the delay medium. A wave $W_{IV}$ through the transducer can be defined as follows:

$$W_{IV} = C'\cos\frac{n\pi y}{b} e^{-j(\gamma x - wt)} + C'\cos\frac{n\pi y}{b} e^{j(\gamma x - wt)} \quad (5)$$

$$= C''\cos\frac{n\pi}{b} y \cos \gamma x \, e^{jwt}$$

For the sake of brevity, k, $\gamma$ is presumed to be equal to values in the delay medium.
From a boundary condition $$\left.\frac{\partial W_{IV}}{\partial x}\right|_{x=L} = 0, \sin x \bigg|_{x=L} = 0,$$

and hence $L=0, \pi, 2\pi, \ldots n\pi$

If $L=0$ at the point $x=L$, $\gamma(L-T)=\pi$ at a point $x=L-T$ because of the relationship $T=\lambda/2$ between the resonant frequency of the transducer and the thickness T. From the equation (5), standing waves are generated in the transducer along the direction of Y as shown in FIG. 6 and along the direction of X as shown in FIG. 5. The standing waves have waveforms such that they vibrate exteriorly of the transducer, but no output is produced by the output transducer since electromotive forces are cancelled out as a whole. Stated otherwise, the delay line with the boundary surfaces (A-B, C-D) of the transducer lying flush with the major faces of the delay medium will not operate in a dispersive mode. If the delay medium is thicker, that is, if the standing wave as shown in FIG. 4 has a wavelength of a few $\lambda$ or more (experimentally, 5 or more), it will be difficult to obtain effective standing waves, and the delay line will operate in a dispersive mode.

It is now assumed that a transducer as defined by A'-B'-C'-D' is bonded. The dispersive mode wave progressing through the medium, as expressed by the equation (4), does not satisfy the boundary condition in the direction of Y $$\left.\frac{\partial W_{III}}{\partial y}\right|_{y=\pm b} = 0$$

and no standing wave is generated in the direction of Y, and only a standing wave in the direction of X is produced as shown in FIG. 5. Accordingly, this delay line operates in a dispersive mode. The same holds true with a transducer as defined by A-A'''-C'''-D.

It is apparent that with a transducer A''-B''-C''-D, the delay line operates well in a dispersive mode. A transducer as defined by A''-B'''-C-D is practically effective as a shear mode transducer, as disclosed in Japanese Patent Laid-Open Publication No. 50-134350, and the fact that a delay line with such a transducer will not operate in a dispersive mode can clearly be explained only by the foregoing theory.

According to the prior art as described in the above various publications, the thickness of the delay medium should be five times or more greater than the wavelength of an ultrasonic signal propagating therethrough, and preferably be twice larger than the wavelength for obtaining a practical solid delay line, and this requirement is experimentally established. In fact, those glass delay mediums which find widest use in color television receivers have a thickness ranging from 1 mm to 1.2 mm with a central frequency of about 3.6 MHz. Since the wavelength of the ultrasonic signal propagating in the delay medium is about 0.6 mm, the thickness of the medium is selected to be about 1.5 to 2 times the wavelength.

The glass delay lines of such a central frequency can have a transmission band of about 2 MHz. However, glass delay lines used in video cameras and other broadcasting equipment are required to have as wide a transmission band as possible, ranging from 5 MHz to 10 MHz. Therefore, the central frequency is also selected to be in the range from 10 MHz to 30 MHz.

With the central frequency being higher, the wavelength of the signal propagating in the medium becomes shorter; for example, the maximum thickness of the medium should be selected to be about 0.3 mm for the central frequency of 30 MHz. Such a glass delay medium is practically infeasible as it can easily be broken. Those delay mediums having a thickness five times or more greater than the wavelength and fabricated according to the conventional process suffer from severe spurious signals and hence poor characteristics.

Therefore, prior delay lines having high central frequencies are limited to a construction having a glass delay medium about 5 mm thick with square or circular transducers attached and employing a bulk wave. Such a delay line is quite costly as it cannot be mass-produced by way of a slicing process as described above, and cannot be reduced in weight and size.

SUMMARY OF THE INVENTION

With the foregoing prior problems in view, it is an object of the present invention to provide a shear mode delay line in which a dispersive mode is suppressed to a practically sufficient degree.

Another object of the present invention is to provide a delay line capable of sufficiently suppressing a dispersive mode with a delay medium used having a thickness several times greater than the wavelength of a propagating signal which has a relatively high frequency.

According to the present invention, the major faces of the delay medium as shown in FIG. 1 and the boundary surfaces of the transducers are ground to a surface roughness which is one-twentieth or less of the wavelength of an ultrasonic signal propagating in hte medium, with the result that the thickness of the medium can be about 20 times greater than the wavelength for practical applications.

Variations in the distance between the major faces sandwiching the medium in which the signal propagates are reduced to one-twentieth or smaller of the wavelength, so that the generation of a dispersive mode signal is prevented.

Furthermore, the transducer material is selected such that the wavelength of the ultrasonic signal propagating in the transducers is longer than that of the ultrasonic signal propagating in the delay medium, for preventing a dispersive mode from being generated in the transducers even after the boundary surfaces of the transducers and the major faces of the delay medium are ground simultaneously under the same conditions. The surface roughness referred to above is a distance between crests 14 and bottoms 15 on the rough surface, as shown in FIG. 2.

The above objects can be achieved by a solid ultrasonic delay line comprising a delay medium having two parallel major faces and at least three end faces intersecting said major faces, an input transducer bonded to one of said end faces and polarized in a direction parallel to said major faces for transmitting an ultrasonic signal in a shear mode into said delay medium, and an output transducer bonded to one of said end faces for converting said ultrasonic signal having propagated through said delay medium into an electrical signal, said input and output transducers having boundary surfaces lying flush with said two major faces of said delay medium, said major faces and said boundary surfaces being ground to a surface roughness which is one-twentieth or smaller of the wavelength of the ultrasonic sigal propagating through said delay medium, said major faces sandwiching a path of the ultrasonic signal propagating through said delay medium and being spaced from each other by a distance which is subjected to variations that are one-twentieth or smaller of the wavelength of the ultrasonic signal propagating through said delay medium.

Further according to the present invention, additional transducers are joined to the input and output transducers remote from the delay medium and have the same thickness and width as those of the input and output transducers, the additional transducers having surfaces lying flush with the major faces of the delay medium. The input and output transducers and additional transducers jointly constitute two transducer pairs. A first lead wire extends from an interface between each of the transducer pairs and a second lead wire extends from interconnected opposite surface of the transducer pair with the transducers in each pair having different axes of polarization. With this arrangement, the solid ultrasonic delay line operates in a shear mode while sufficiently suppressing dispersive mode waves.

Further according to the present invention, backings are joined to the input and output transducers remotely from the delay medium and have an acoustic impedance equal or similar to that of the delay medium, the backings having the same thickness as that of the delay medium and the input and output transducers. The backings have surfaces lying flush with the major surfaces of the delay medium and ends remote from the input and output transducers and shaped to a contour which does not reflect the ultrasonic signal, the shaped ends being coacted with absorbent materials. The solid ultrasonic delay line thus constructed serves to suppress dispersive mode signals to a greater degree.

These and other objects of the invention will become apparent from the following description of embodiments thereof when taken together with the drawings.

DETAILED DESCRIPTION OF THE PREFERRED EMBODIMENTS

Figure 1:
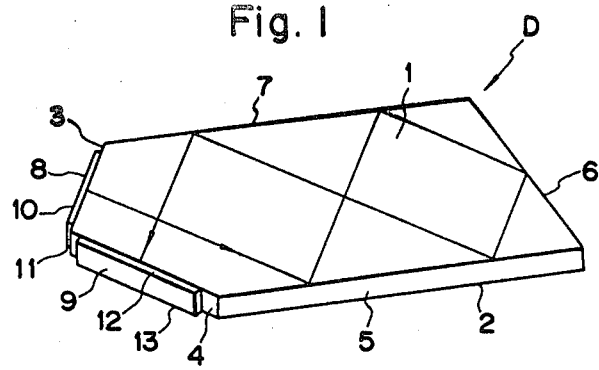
FIG. 1 is a perspective view of a conventional solid ultrasonic delay line.
Figure 2:
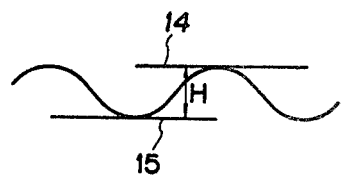
FIG. 2 is a diagram illustrative of a definition of a surface roughness.

Preferred embodiments of the present invention will now be described with reference to the drawings.

EXAMPLE 1

Major faces of a glass delay medium having a signal propagation speed of 2,400 m/sec. were spaced 0.8 mm from each other, and transducers were driven with a central frequency of 20 MHz. The amount of attenuation of a dispersive mode varied according to surface roughnesses of the major faces of the medium as indicated in the Table given below. The wavelength of the signal was $120 \times 10^{-6}$ m, and the transducers were made of lithium niobate ($LiNbO_3$).

|  | Surface roughness (grain size of abrasive) | Propagation wavelength/ surface roughness | Attenuation in dispersive mode (ratio to zero mode) |
|---|---|---|---|
| Comp. Ex. 1 | $24 \times 10^{-6}$ m (# 360) | 5 | 11 dB |
| Comp. Ex. 2 | $10 \times 10^{-6}$ m (# 800) | 12 | 16 dB |
| Inventive Ex. 1 | $3.9 \times 10^{-6}$ m (# 2000) | 31 | 28 dB |
| Inventive Ex. 2 | $2.5 \times 10^{-6}$ m (# 3000) | 48 | 34 dB |
| Inventive Ex. 3 | Mirror finish | ∞ | 40 dB |

The dispersive mode signal cannot sufficiently be suppressed in the Comparative Examples 1 and 2. However, by reducing the surface roughness of the major faces of the medium, the dispersive mode signal can be reduced as with the Inventive Examples.

Since the amount of attenuation of the dispersive mode should be 26 dB or higher to render the delay line practically usable, it will be understood from the above Table that the surface roughness of the major faces of the medium should be about one-twentieth of the wavelength or smaller.

The amount of attenuation of the dispersive mode was rendered insufficient as with the Comparative Examples 1 and 2 when the surface roughness of one of the major faces of the medium, or portions of the majors faces which sandwich the path of propagation of signals was increased. The thickness of the medium has a limit which is 20 times the wavelength and should preferably be smaller than 15 times the wavelength.

EXAMPLE 2

According to the present invention, the surface roughness of the major faces of the delay medium and the boundary surfaces of the transducer which are to be ground at the same time was selected to be $3.9 \times 10^{-6}$ m. and the transducers were made of a different material. When a signal having a frequency of 10 MHz was applied, the following resulted:

| Transducer | Attenuation in dispersive mode (ratio to zero mode) |
|---|---|
| $LiNbO_3$ | 38 dB |
| PZT | 27 dB |

The thickness of the transducers in the direction of transmission or reception of signals should be half of the wavelength of the signal propagating in the transducers.

This Example indicates that the wavelength of the signal propagating in the transducers is longer than that of the signal in the medium where the transducers are made of lithium niobate and is shorter than that of the signal in the medium where the transducers are made of PZT, with the result that the dispersive mode is generated in different manners.

The above table shows that the transducers of lithium niobate are much better than those of PZT.

Figure 7:
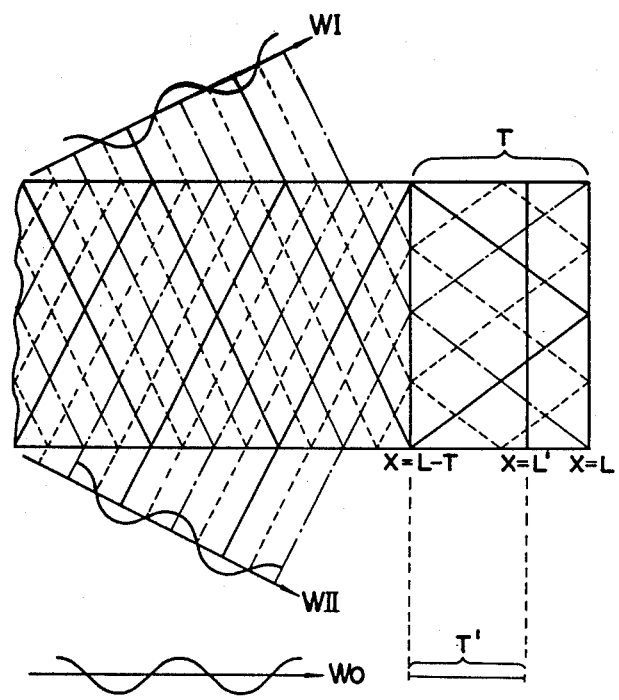
FIGS. 7 and 8 are diagrams illustrating waves propagating in a delay line according to an embodiment of the present invention.

Additional explanation will be given for the Example 2. In FIG. 7, waves $W_I$, $W_{II}$ in the delay medium become waves $W_I'$, $W_{II}'$ in the transducers.

$$W_I' = Ce^{j(k'y+\gamma'x)}e^{j\omega t}$$

$$W_{II}' = Ce^{-j(k'y-\gamma'2x)}e^{j\omega t}$$

$$W_{III}' = C' \cos k'y e^{-j(\gamma'x - \omega t)}$$

k and $\gamma$ are changed into $k'$, $\gamma'$ within the transducers. The speed of propagation Vso in the medium is larger than the speed of propagation V'so in the transducers.

Since $V'so > Vso$, the thickness T of the transducer for receiving this mode wave with $n=3$ most efficiently is larger than half of the wavelength of the signal propagating in the medium as is evident from FIG. 7. As described above, if the boundary condition is properly set up under the above condition, there is generated a standing wave in the direction of Y and no output can be picked up from the transducer.

A signal in a zero mode propagates as shown by Wo, and can be received with the maximum efficiency by a transducer having a thickness T' which is half of the wavelength. Accordingly, the thickness of an actual output delay line transducer is selected to be T'. Although the transducer of such a thickness cannot receive the $n=3$ mode wave with the maximum efficiency, the standing wave keeps on being generated and allows the transducer to vibrate in a magnitude smaller than that of the transducer of the thickness of T. Therefore, the transducer becomes less receptive of a dispersive mode signal.

Figure 8:
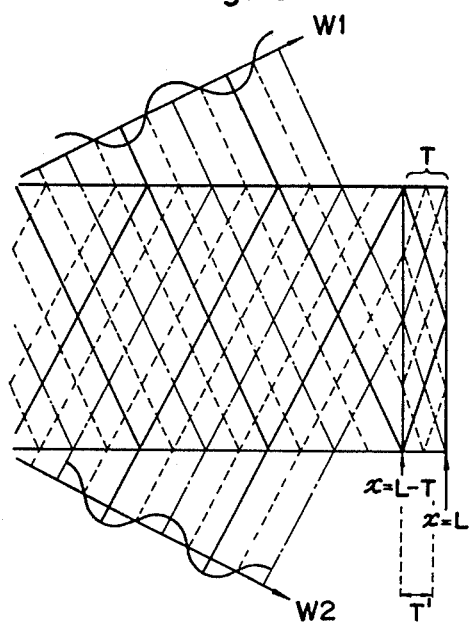

If the speed of propagation of a signal in the transducer is lower than that in the medium as shown in FIG. 8, the difference between T and T' becomes small, and when the boundary condition is disturbed, the resulting condition is close to the reception of a dispersive mode wave with the maximum efficiency.

The standing wave in the direction of Y in the transducer will be as follows if the propagation constant changes: Assuming that the wave in the transducer is expressed by $W_{III}' = C' \cos k'y e^{-j(\gamma'x - \omega t)}$, then, from a boundary condition $$\left.\frac{\partial W_{III}}{\partial y}\right|_{y = \pm b} = 0, \sin k'y \bigg|_{y = \pm b} = 0,$$

and hence $k' = n\pi/b \ldots (n = 0, 1, 2, 3, \ldots)$

The above value indicates that the same standing wave will be generated irrespective of the speed of sound in the transducer.

Therefore, by rendering $Vso' > Vs$, the ratio of the surface roughness to the propagating wavelength is greater in the transducer than the medium even if the major faces of the medium and the boundary surfaces of the transducers are ground to the same surface roughness. The transducers in which the standing wave tends to be disturbed mostly are accordingly improved.

As described above, the thickness of the transducer for receiving a signal propagating in the delay medium most efficiently is equal to half of the wavelength of the signal travelling within the transducer. If the transducer thickness were smaller or greater than half of the wavelength, the output from the transducer would be reduced.

Figure 3:
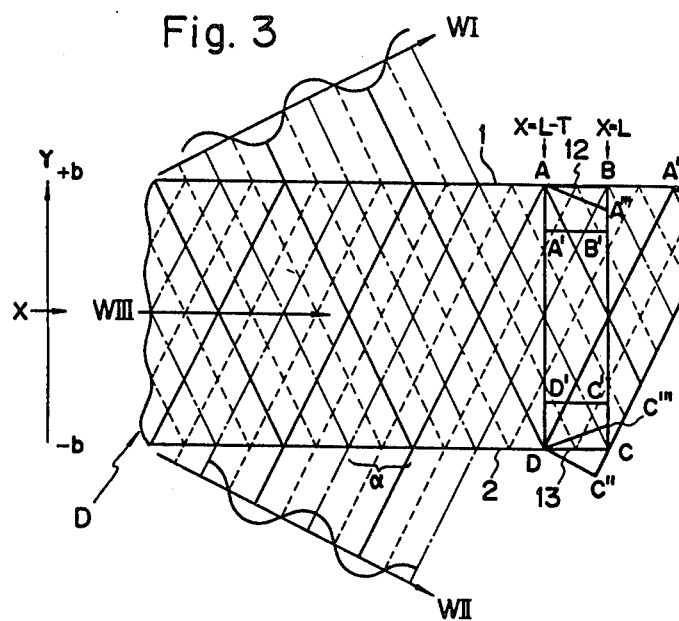
FIGS. 3 through 6 are diagrams explanatory of waves propagating in a shear mode delay line.
Figure 4:
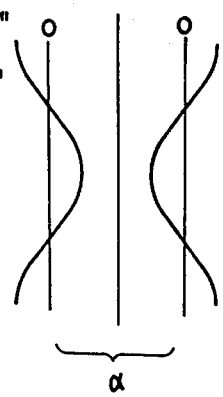
Figure 5:
Figure 6:

As mentioned with reference to FIG. 3, with the shear mode delay line in which the major faces of the medium and the boundary surfaces of the transducers are aligned, signals other than in the zero mode become a standing wave cancelling charges on the transducer surface and are not produced as an output, even if the thickness of the transducer is selected so that the latter can receive the propagating signal with the maximum efficiency.

With the present invention, surface irregularities which are large with respect to the propagating wavelength are removed from the major faces of the medium, and the longitudinal thickness of the medium is kept to a high accuracy for stable generation of the above standing wave. With the display line as shown in FIG. 7, the material of transducers which are positioned on the opposite ends of an ultrasonic signal path and at which the standing wave is mostly likely to be disturbed is selected so that the apparent surface roughness of the transducers is smaller than that of the medium. The delay line as illustrated in FIG. 7 is of improved characteristics since the thickness of the transducer most receptive of the dispersive mode wave can differ from the optimum thickness of the transducer for receiving a zero mode signal.

With the above arrangement, there is provided a solid ultrasonic delay line capable of sufficiently suppressing a dispersive mode signal with a delay medium having a thickness 5 times to 20 times greater than the wavelength of a signal propagating in the medium, a delay medium which has conventionally be unable to be employed due to its poor characteristics.

A solid ultrasonic delay line according to another embodiment will now be described.

Figure 9:
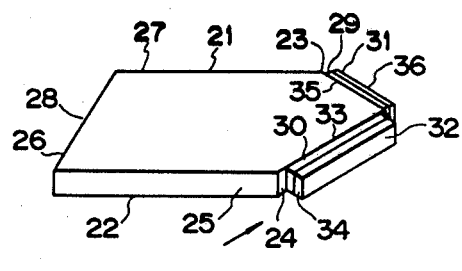
FIG. 9 is a perspective view of a delay line according to another embodiment of the present invention.
Figure 11:
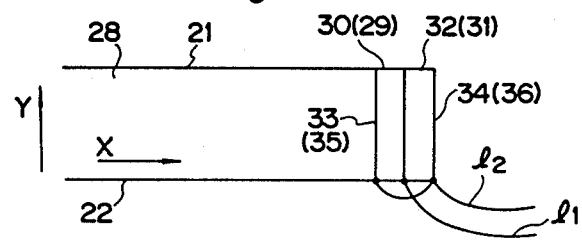
FIG. 11 is a side elevational view as seen in the direction of the arrow of FIG. 9, showing lead wires extending from transducers.

As shown in FIG. 9, the delay line comprises a delay medium 28 having a pair of parallel upper and lower major faces 21, 22 and five end faces 23, 24, 25, 26, 27 intersecting the upper and lower major faces 21, 22, input and output transducers 29, 30 joined respectively to the end faces 23, 24 and having the same thickness as that of the delay medium 28, the input and output transducers 29, 30 having surfaces lying flush with the upper and lower major faces 21, 22, and transducers 31, 32 joined respectively to backs of the input and output transducers 29, 30 and having the same thickness and width as those of the transducers 29, 30, the transducers 31, 32 having surfaces lying flush with the upper and lower major surfaces 21, 22. The transducers 29, 30 and 31, 32 have different axes of polarization since, as shown in FIG. 11, a first lead wire $l_1$ extends from the interface between the transducers 30, 32 (or 29, 31), and a second lead wire $l_2$ extends from surfaces 33, 34 (or 35, 36) opposite to the interface between the transducers 30, 32 (or 29, 31) and interconnected by a lead wire.

With the delay line thus constructed, the delay medium 28 and the surfaces of the transducers 29, 31 and 30, 32 which lie flush with the upper and lower major faces 21, 22 are ground to a surface roughness which is 1/20 or less of the wavelength of the propagating signal. Variations in the distance between those surfaces flush with the upper and lower major faces 21, 22 are reduced to 1/20 or smaller of the propagating wavelength. The material of the input and output transducers is selected such that the wavelength of an ultrasonic wave propagating in the transducers 29, 30, 31, 32 is rendered longer than that of an ultrasonic wave propagating in the delay medium 28. As an example, the delay line as shown in FIG. 1 was used and the delay medium D was made of glass, the input and output transducers 9, 10 were made of lithium niobate ($LiNbO_3$), with the thickness of the transducers being ½ of the wavelength ($\lambda$) (the thickness is $\lambda$ according to the presenmuch greater as compared with the amount of attenuation in a zero mode.

Figure 10:
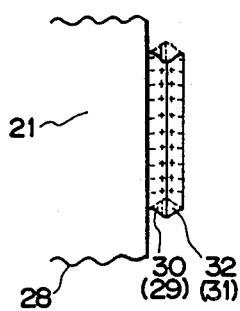
FIG. 10 is a diagram showing the manner in which transducers of the delay line of FIG. 9 vibrate.

Under the above condition, the wave (ultrasonic signal) propagating from the input transducers 29, 31 through the delay medium 28 causes the output transducers 30, 32 to vibrate in mutually different directions of polarization as shown in FIG. 10. Since the output transducers 30, 32 are of the same thickness and width, the wave of the same wavelength (1$\lambda$) as the propagating wavelength ($\lambda$) is delivered into the output transducers, that is, a standing wave in the direction of X has the wavelength of 1$\lambda$, so that a standing wave in the direction of Y can more easily be produced than the transducer thickness is $\lambda/2$, with the result that reception of a signal in a dispersive mode can easily be cancelled out.

If two transducers were vibrated in the same direction as the direction of polarization, the two transducers would act as a single transducer having a doubled thickness (with the resonant frequency being half), and no desired result can be achieved.

By constructing the input transducers 29, 31 like the output transducers 30, 32, the input transducers 29, 31 can transmit signals only in the zero mode more easily without being affected by the dispersive mode.

With the foregoing embodiment, transducers having the same thickness and width as those of input and output transducers are joined to the input and output transducers, and the two transducers in each combination are vibrated with their axes of polarization being different from each other. Since the standing wave in the direction of X in the transducer has the same wavelength as that of the propagating wave, the standing wave in the direction of Y can more easily be generated and signals transmitted and received in the dispersive mode can be cancelled out, resulting in improved delay line characteristics.

A delay line according to still another embodiment will be described.

Figure 12:
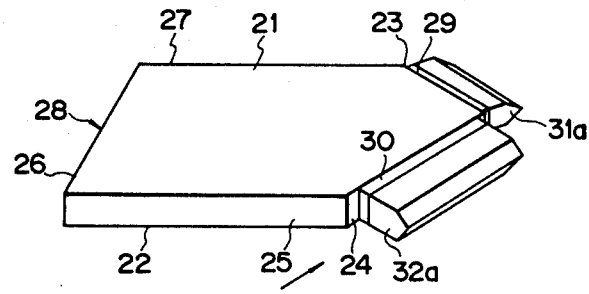
FIG. 12 is a perspective view of a delay line according to still another embodiment of the present invention.

In FIG. 12, the delay line is composed of a delay medium 28 having a pair of upper and lower major faces 21, 22 and five end faces 23, 24, 25, 26, 27 intersecting the upper and lower major faces 21, 22, input and output transducers 29, 30 joined to the end faces 23, 24, respectively, and having the same thickness as that of the delay medium 28, backings 31a, 32a joined to backs of the transducers 29, 30 and having the same thickness as that of the transducers 29, 30, and absorbent materials 34 (FIG. 13) coated on the backings 31a, 32a on their surfaces remote from the transducers. The input and output transducers 29, 30 and the backings 31a, 32a have surfaces lying flush with the upper and lower major faces 21, 22 of the delay medium 28.

With the delay line thus constructed, the delay medium 28 and the surfaces of the transducers 29, 31 and the backings 31a, 32a which lie flush with the upper and lower major faces 21, 22 are ground to a surface roughness which is 1/20 or less of the wavelength of the propagating signal. Variations in the distance between those surfaces flush with the upper and lower major faces 21, 22 are reduced to 1/20 or smaller of the propagating wavelength. The material of the input and output transducers is selected such that the wavelength of an ultrasonic wave propagating in the transducers 29, 30 is rendered longer than that of an ultrasonic wave propagating in the delay medium 28.

The wave propagates from the input transducer 29 through the delay medium 28 and passes through the output transducer 30, after which the wave propagates in the backing 32a in which the standing wave is neatly shaped. More specifically, the output transducer 30 and the backing 32a have surfaces lying flush with the upper and lower major faces 21, 22 of the delay medium 28, and the delay medium 28 and the backing 32a are made of materials having similar or equal acoustic impedances. With such an arrangement, the output transducer 30 is driven by a standing wave exactly in the direction of Y (in the direction of the arrow) from both front and rear surfaces thereof, thus cancelling out signals received in the dispersive mode.

Figure 13:
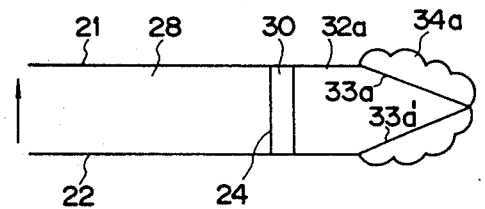
FIG. 13 is a side elevational view as seen in the direction of the arrow of FIG. 12.

As illustrated in FIG. 13, the backing 32a has a distal end remote from the surface thereof joined to the output transducer 30 and shaped to a contour which does not reflect ultrasonic signals. More specifically, the backing 32a has tapered end faces 33a, 33a' extending from the surfaces thereof flush with the upper and lower major faces 21, 22, respectively, with an absorbent material 34a (such as epoxy resin) is coated on the tapered end faces 33a, 33a', so that any reflected wave resulting from the wave having passed through the output transducer 30 can be eliminated by the distal end of the backing 32a and the absorbent material 34a. Thus, the standing wave in the direction of Y is not adversely affected by the reflected wave which would otherwise be harmful.

The input transducer 29 is also provided with the backing 31a and an absorbent material (not shown) similar to those shown in FIG. 13, so that the input transducer 29 can transmit a signal in the zero mode without being influenced by a dispersive mode wave.

According to the above embodiment, backings having the same thickness as that of a delay medium and input and output transducers are attached to those surfaces of the input and output transducers which are remote from their surfaces joined to the delay medium, the backings having an acoustic impedance equal or similar to that of the delay medium. The input and output transducers and the backings have surfaces lying flush with upper and lower parallel major faces of the delay medium. The backings have ends remote from the input and output transducers and shaped to a contour which fails to reflect ultrasonic signals, the backing ends being coated with absorbent materials. Thus, the input and output transducers are driven by a proper standing wave in the direction of Y from both front and rear surfaces thereof, with the result that signals transmitted and received in the dispersive mode can be cancelled out. Accordingly, a delay line of improved characteristics can be provided.

Thus, there is provided in accordance with the invention a solid ultrasonic delay line which has the advantages discussed above. The embodiments described are intended to be merely exemplary and those skilled in the art will be able to make variations and modifications in them without departing from the spirit and scope of the inventions. All such modifications and variations are contemplated as falling within the scope of the claims.

What is claimed is:

1. A solid ultrasonic delay line comprising a delay medium having two parallel major faces and at least three end faces intersecting said major faces, an input transducer bonded to one of said end faces and polarized in a direction parallel to said major faces for transmitting an ultrasonic signal in a shear mode into said delay medium, and an output transducer bonded to one of said end faces for converting said ultrasonic signal having propagated through said delay medium into an electrical signal, said input and output transducers having boundary surfaces lying flush with said two major faces of said delay medium, said major faces and said boundary surfaces being ground to a surface roughness which is one-twentieth or smaller of the wavelength of the ultrasonic signal propagating through said delay medium, said major faces sandwiching a path of the ultrasonic signal propagating through said delay medium and being spaced from each other by a distance which is subjected to variations that are one-twentieth or smaller of the wavelength of the ultrasonic signal propagating through said delay medium, said distance ranging from greater than 5 times to 20 times the wavelength of the ultrasonic signal propagating through said delay medium.

2. A solid ultrasonic delay line according to claim 1, wherein said delay medium is made of glass.

3. A solid ultrasonic delay line according to claim 1, wherein said wavelength of said ultrasonic signal is longer in said transducers than in said delay medium.

4. A solid ultrasonic delay line according to claim 1 further comprising backings joined respectively to said input and output transducers remotely from said delay medium, said backings having an acoustic impedance equal or similar to that of said delay medium, said input and output transducers and said backings having surfaces lying flush with said upper and lower major faces of said delay medium.

5. A solid ultrasonic delay line according to claim 4, wherein said backings have an end remote from said input and output transducers and shaped to a contour which fails to reflect the ultrasonic signal, said end of said packings being coated with an absorbent material for absorbing said ultrasonic signal.

6. A solid ultrasonic delay line according to claim 4 or 5, wherein said major faces of said delay medium and said surfaces of said input and output transducers and said backings lying flush with said major faces are ground to a surface roughness which is one-twentieth or smaller of the wavelength of the ultrasonic signal propagating through said delay medium, said surfaces being spaced from each other by a distance which is subjected to variations that are one-twentieth of said wavelength of the ultrasonic signal propagating through said delay medium.

7. A solid ultrasonic delay line according to claim 4 or 5, wherein said wavelength of the ultrasonic signal propagating through said transducers is longer than that of the ultrasonic signal propagating through said delay medium.

8. A solid ultrasonic delay line according to claim 6, wherein said wavelength of the ultrasonic signal propagating through said transducers is longer than that of the ultrasonic signals propagating through said delay medium.

9. A solid ultrasonic delay line comprising a solid delay medium as of glass having upper and lower parallel major faces and at least three end faces intersecting said major faces, input and output transducers each joined to one of said end faces for transmitting and receiving an ultrasonic signal, said input and output transducers having the same thickness as that of said delay medium, said input and output transducers having surfaces lying flush with said upper and lower major faces of said delay medium, transducers joined to said input and output transducers, respectively, remotely from the end faces to which said input and output transducers are joined, said transducers having the same thickness and width as those of said input and output transducers and having surfaces lying flush with said upper and lower major faces, said transducers and said input and output transducers constituting two joined transducer pairs, a first lead wire extending from an interface between each of said transducer pairs, and a second lead wire extending from interconnected opposite surfaces of said each transducer pair with the transducers in each pair having different axes of polarization.

10. A solid ultrasonic delay line according to claim 9, wherein said major faces of said delay medium and said surfaces of said input and output transducers and said transducers are ground to a surface roughness which is one-twentieth or smaller of the wavelength of the ultrasonic signal propagating through said delay line, said surfaces being spaced from each other by a distance which is subjected to variations that are one-twentieth of said wavelength of said ultrasonic signal propagating through said delay medium.

11. A solid ultrasonic delay line according to claim 9 or 10, wherein said wavelength of the ultrasonic signal propagating through said two transducer pairs is longer than that of the ultrasonic signal propagating through said delay medium.

* * * * *